(12) United States Patent
Jacobson et al.

(10) Patent No.: US 10,566,896 B2
(45) Date of Patent: Feb. 18, 2020

(54) HETEROGENEOUSLY INTEGRATED POWER CONVERTER ASSEMBLY

(71) Applicant: RAYTHEON COMPANY, Waltham, MA (US)

(72) Inventors: Boris S. Jacobson, Westford, MA (US); Steven D. Bernstein, Brighton, MA (US); Steven M. Lardizabal, Westford, MA (US); Jason Adams, Medway, MA (US); Jeffrey R. Laroche, Austin, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/055,792

(22) Filed: Aug. 6, 2018

(65) Prior Publication Data
US 2019/0149039 A1 May 16, 2019

Related U.S. Application Data

(60) Provisional application No. 62/542,023, filed on Aug. 7, 2017.

(51) Int. Cl.
| | |
|---|---|
| *H02M 1/44* | (2007.01) |
| *H01F 27/28* | (2006.01) |
| *H01F 27/36* | (2006.01) |
| *H05K 1/16* | (2006.01) |
| *H02M 1/42* | (2007.01) |

(52) U.S. Cl.
CPC .......... *H02M 1/44* (2013.01); *H01F 27/2804* (2013.01); *H01F 27/2885* (2013.01); *H01F 27/365* (2013.01); *H02M 1/4258* (2013.01); *H05K 1/165* (2013.01);
(Continued)

(58) Field of Classification Search
CPC ... H02M 1/44; H02M 1/4258; H01F 27/2804; H01F 27/365; H01F 27/2885; H01F 2027/2819; H01F 2027/2809; H05K 1/165; H05K 2201/086; H04B 1/1607
See application file for complete search history.

(56) References Cited

U.S. PATENT DOCUMENTS

| | | |
|---|---|---|
| 5,602,554 A | 2/1997 | Cepas et al. |
| 5,990,776 A | 11/1999 | Jitaru |

(Continued)

FOREIGN PATENT DOCUMENTS

WO   2011103259 A3   1/2012

OTHER PUBLICATIONS

Stéphane Bellenger et al, "Silicon Interposers with Integrated Passive Devices: Ultra-Miniaturized Solution using 2.5D Packaging Platform", 2014, Online retrieved on Aug. 6, 2018, DRL<https://webcache.googleusercontent.com/search?q=cache:9xsf_kcWSCMJ:https://www.digikey.lu/Web%2520Export/Supplier%2520Content/ipdia-1210/pdf/ipdia-silicon-interposers-passive-devices.pdf+&cd=1&hl=en&ct=cInk&gl=us>, 8 pages.

(Continued)

*Primary Examiner* — Alex Torres-Rivera
(74) *Attorney, Agent, or Firm* — Cantor Colburn LLP

(57) ABSTRACT

A power converter assembly is provided and includes high quality factor (Q) shield-to-transistor integrated low-inductance capacitor elements to divert common mode (CM) currents, high Q shield-to-shield integrated low-inductance capacitor elements to compliment line-to-line filter capacitors and high Q baseplate integrated low-inductance capacitor elements to attenuate residual CM currents.

11 Claims, 4 Drawing Sheets

(52) U.S. Cl.
CPC ............... *H01F 2027/2809* (2013.01); *H01F 2027/2819* (2013.01); *H05K 2201/086* (2013.01)

(56) References Cited

U.S. PATENT DOCUMENTS

| | | | | |
|---|---|---|---|---|
| 6,054,914 | A * | 4/2000 | Abel | H01F 1/344 336/200 |
| 6,087,922 | A * | 7/2000 | Smith | H01F 27/2847 336/200 |
| 6,114,939 | A * | 9/2000 | Wittenbreder | H01F 27/2804 336/200 |
| 7,199,569 | B1 * | 4/2007 | Nakahori | H02M 3/335 323/355 |
| 8,461,669 | B2 | 6/2013 | Yang et al. | |
| 8,558,344 | B2 | 10/2013 | Chen | |
| 2009/0295528 | A1 * | 12/2009 | Silva | H01F 3/10 336/200 |
| 2010/0289610 | A1 | 11/2010 | Jacobson et al. | |
| 2011/0254649 | A1 * | 10/2011 | Hollevoet | H01F 27/2852 336/200 |
| 2013/0328165 | A1 | 12/2013 | Harburg et al. | |
| 2015/0340422 | A1 | 11/2015 | Lee et al. | |
| 2016/0036330 | A1 | 2/2016 | Sturcken | |
| 2016/0064470 | A1 * | 3/2016 | Mihailovich | H01F 17/0013 257/531 |
| 2016/0087536 | A1 * | 3/2016 | Jacobson | H02M 3/33507 363/21.01 |

OTHER PUBLICATIONS

ISR/WO, Issued Nov. 20, 2018, RAY0368PCT, PCT Application No. PCT/US2018/045359, 18 pages total.

Portolan et al., "The Analysis and Design of an Inter-Winding Shielding Structure of a High-Frequency Transformer", IEEE, 2007, 6 pages.

* cited by examiner

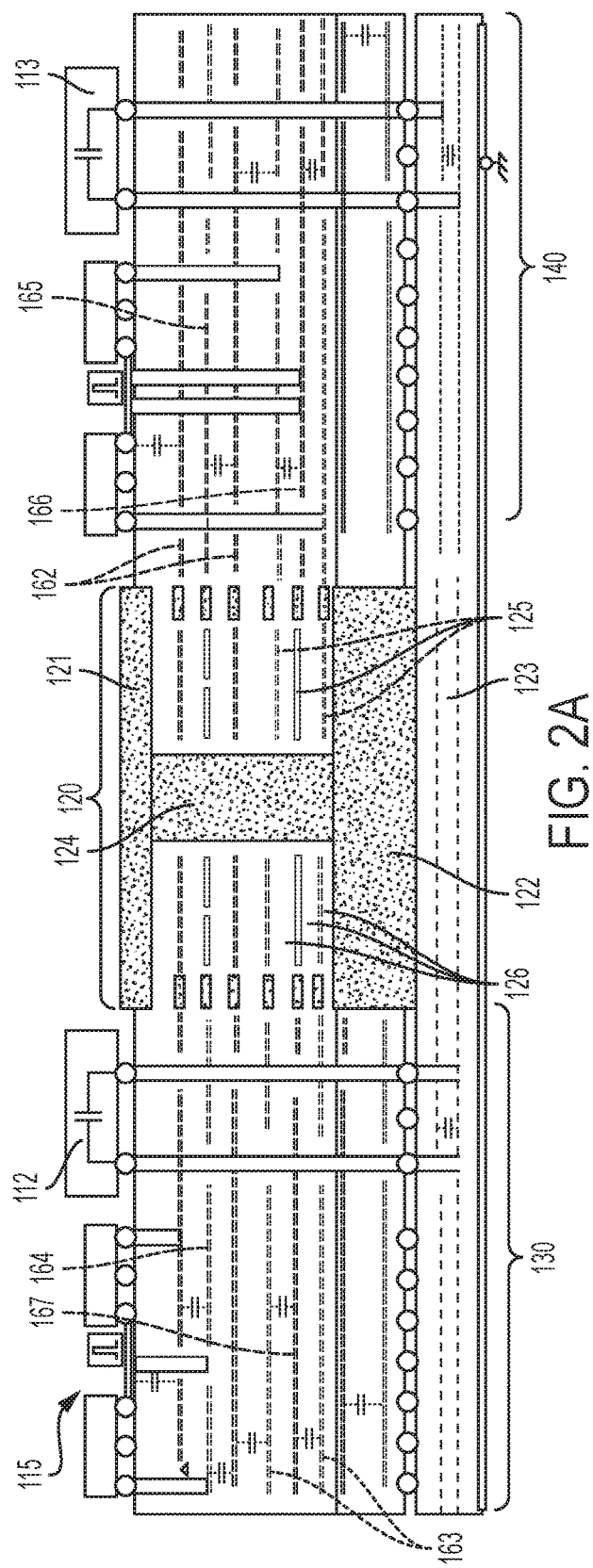
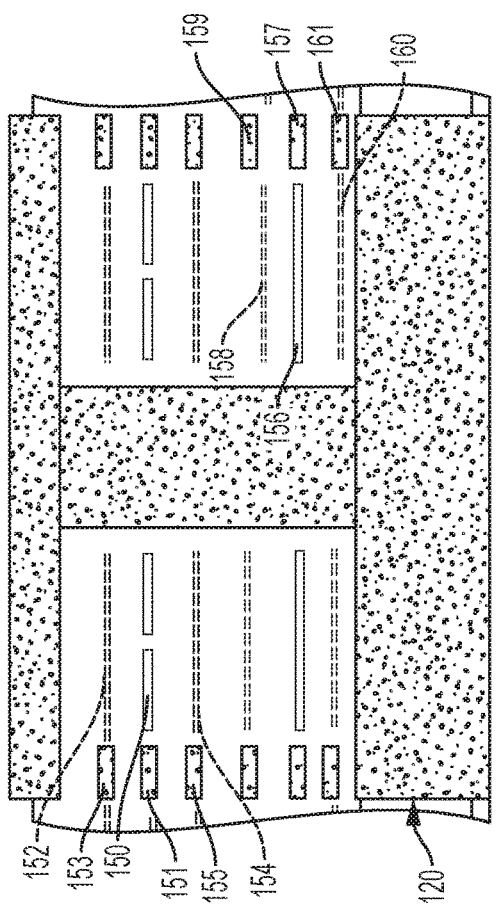
FIG. 2A
FIG. 2B

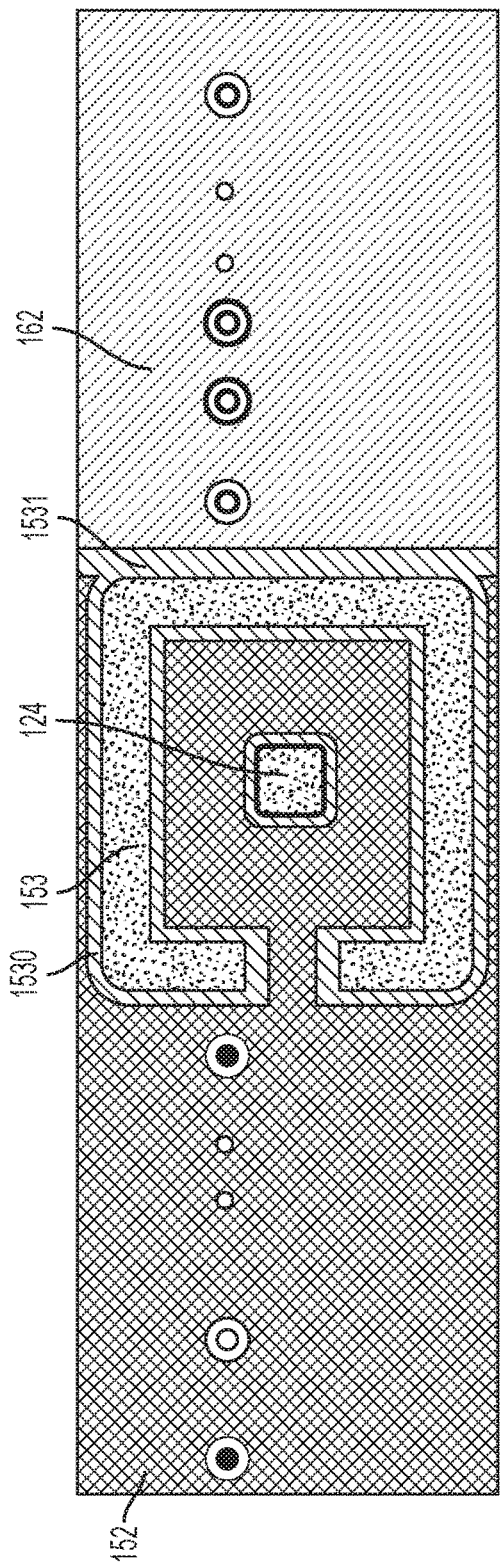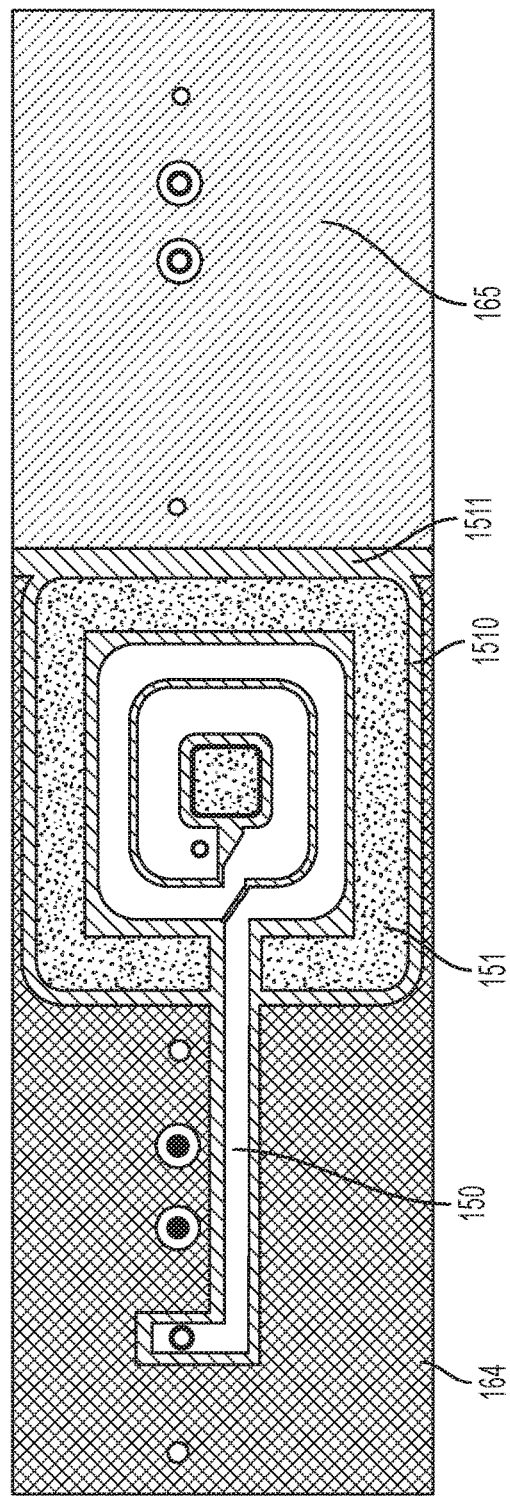

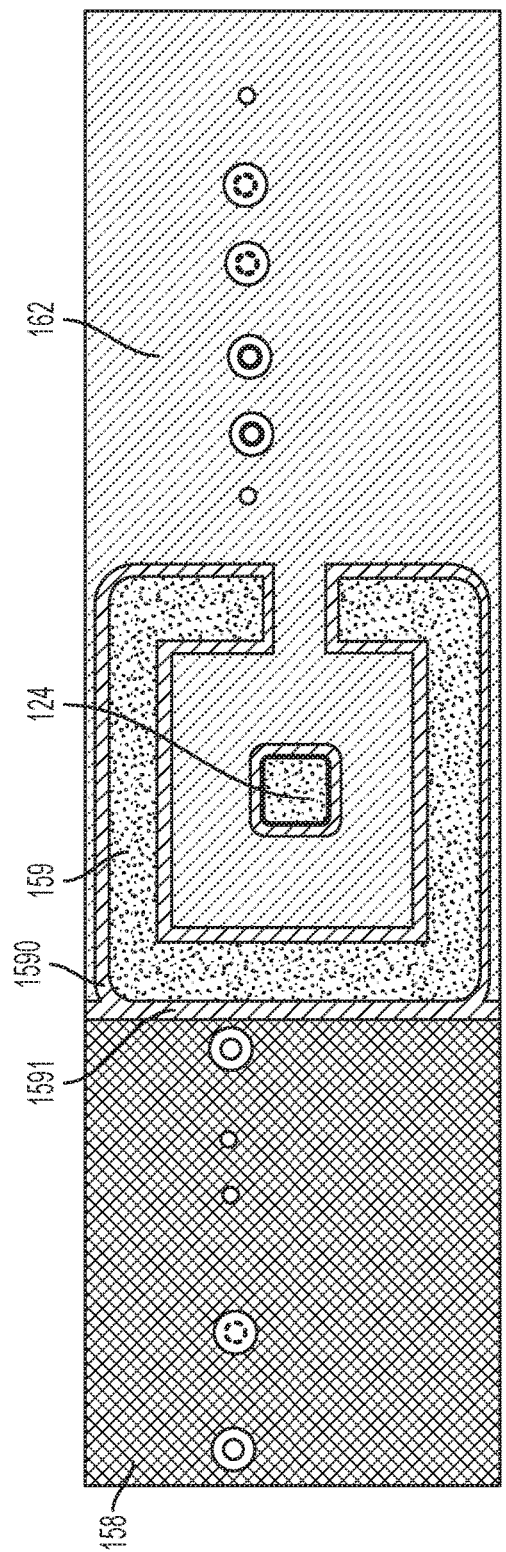
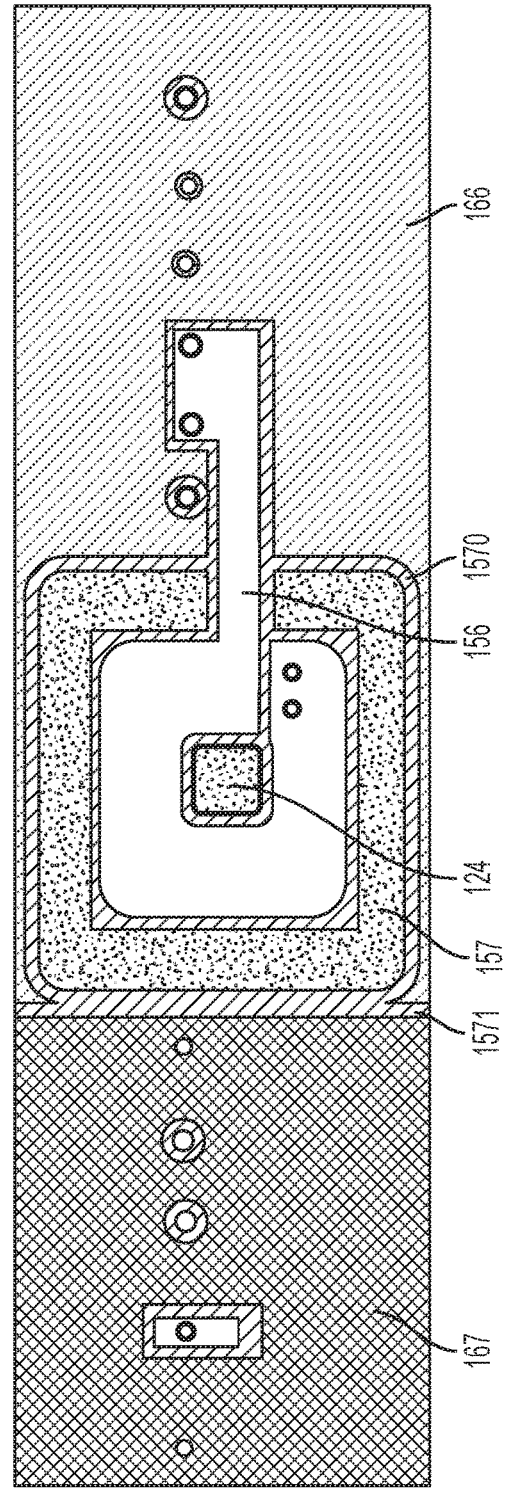
FIG. 5
FIG. 6

HETEROGENEOUSLY INTEGRATED POWER CONVERTER ASSEMBLY

CROSS-REFERENCE TO RELATED APPLICATIONS

This application claims the benefit of U.S. Provisional Patent Application No. 62/542,023, filed Aug. 7, 2017, the disclosure of which is incorporated by reference herein in its entirety.

FEDERAL SPONSORED RESEARCH AND DEVELOPMENT

This invention was made with government support under contract number N00014-13-C-0231 awarded by United States Navy. The government has certain rights in the invention.

BACKGROUND

The following description relates to a heterogeneously integrated power converter assembly and, more specifically, to an antenna power system with an integrated direct current (DC)/DC converter.

In conventional antenna power systems for radar and other similar applications, there are typically massive numbers of off-array subsystems and electro-magnetic interference (EMI) filters that are required to achieve voltage quality. For example, a radar system can include a power distribution unit (PDU), an aperture power room (APR) for power conversion and distribution, multi-cable distribution and an array antenna.

The PDU can include a 12-phase transformer that is required to provide a voltage step-down and a power factor correction (PFC) that is equal to a lower total harmonic distortion (THD). The APR can include a plurality of alternating current (AC)/DC converters that receive 12-phase 440 volt AC from the PDU. The multi-cable distribution can include a DC distribution bus that is receptive of DC from the AC/DC converters. The array antenna includes multiple antenna arrays.

Each antenna array includes a number of transmit/receive integrated microwave module (T/RIMM) and multiple transmission/reception (T/R) channels. Each T/RIMM includes a plurality of linear regulators (one per T/R channel) and a DC/DC converter electrically interposed between the plurality of linear regulators and the DC distribution bus. The DC/DC converter serves to provide a voltage step-down, fast dynamic load response in T/R operations and reduces voltage ripples and noise. Each linear regulator provides for fast response and low noise point of load (POL) voltage. Each T/R channel is responsible for T/R operations and includes a power amplifier and a modulator electrically interposed between the power amplifier and a corresponding one of the linear regulators.

BRIEF DESCRIPTION

According to an aspect of the disclosure, a power converter assembly is provided and includes high quality factor (Q) shield-to-transistor integrated low-inductance capacitor elements to divert common mode (CM) currents, high Q shield-to-shield integrated low-inductance capacitor elements to compliment line-to-line filter capacitors and high Q baseplate integrated low-inductance capacitor elements to attenuate residual CM currents.

In accordance with additional or alternative embodiments, the power converter assembly is provided as a galvanically-isolated bridge converter.

According to another aspect of the disclosure, an integrated converter of an antenna power system is provided and includes a baseplate and a transformer area interposed between input and output sections. The transformer area includes a magnetic core top portion, a magnetic core bottom portion disposed on the baseplate, a magnetic core pillar extending between central sections of the magnetic core top and bottom portions and successive layers of shield and magnetic core materials, windings and magnetic core materials and shield and magnetic core materials interleaved between dielectric material layers at opposite sides of the magnetic core pillar.

In accordance with additional or alternative embodiments, the integrated converter is provided as a galvanically-isolated bridge converter.

In accordance with additional or alternative embodiments, the shield materials include metallic materials.

In accordance with additional or alternative embodiments, the magnetic core top and bottom portions have similar widths, the magnetic core pillar has a lesser width than the magnetic core top and bottom portions, and the successive layers of the windings and the magnetic core materials extend outwardly to respective edges of the magnetic core top and bottom portions.

In accordance with additional or alternative embodiments, the successive layers include primary winding materials, first and second primary shield materials above and below the primary winding materials, secondary winding materials and first and second secondary shield materials above and below the secondary winding materials.

In accordance with additional or alternative embodiments, the first and second primary shield materials extend continuously into the transformer area from the input section and the first and second secondary shield materials extend continuously into the transformer area from the output section.

In accordance with additional or alternative embodiments, the first and second primary shield materials discontinuously correspond to shield materials in the output section and the first and second secondary shield materials discontinuously correspond to shield materials in the input section.

In accordance with additional or alternative embodiments, the magnetic core materials in each successive layer of shield and magnetic core materials form a C-shape or a reverse C-shape about the magnetic core pillar.

According to another aspect of the disclosure, an antenna power system is provided and includes an alternating current (AC)/direct current (DC) converter, which is receptive of AC, a common bus, which is receptive of DC from the AC/DC converter and a plurality of transmission/reception (T/R) channels coupled to the common bus. Each T/R channel includes a power amplification assembly and a discrete input capacitor electrically interposed between the common bus and the power amplification assembly. The power amplification assembly includes a discrete output capacitor electrically interposed between a power amplifier and an integrated DC/DC converter comprising shields extending into a transformer area.

In accordance with additional or alternative embodiments, the integrated DC/DC converter is provided as a galvanically-isolated bridge converter.

In accordance with additional or alternative embodiments, the transformer area of the integrated DC/DC converter is interposed between an input section including the discrete input capacitor and an output section including the discrete output capacitor.

In accordance with additional or alternative embodiments, the transformer area of the integrated DC/DC converter includes a magnetic core top portion, a magnetic core bottom portion disposed on a baseplate, a magnetic core pillar extending between central sections of the magnetic core top and bottom portions and successive layers of shield and magnetic core materials, windings and magnetic core materials and shield and magnetic core materials interleaved between dielectric material layers at opposite sides of the magnetic core pillar.

In accordance with additional or alternative embodiments, the shield materials include metallic materials.

In accordance with additional or alternative embodiments, the magnetic core top and bottom portions have similar widths, the magnetic core pillar has a lesser width than the magnetic core top and bottom portions and the successive layers of the windings and the magnetic core materials extend outwardly to respective edges of the magnetic core top and bottom portions.

In accordance with additional or alternative embodiments, the successive layers include primary winding materials, first and second primary shield materials above and below the primary winding materials, secondary winding materials and first and second secondary shield materials above and below the secondary winding materials.

In accordance with additional or alternative embodiments, the first and second primary shield materials extend continuously into the transformer area from the discrete input capacitor and the first and second secondary shield materials extend continuously into the transformer area from the discrete output capacitor.

In accordance with additional or alternative embodiments, the first and second primary shield materials discontinuously correspond to shield materials in the discrete output capacitor and the first and second secondary shield materials discontinuously correspond to shield materials in the discrete input capacitor.

In accordance with additional or alternative embodiments, the magnetic core materials in each successive layer of shield and magnetic core materials form a C-shape or a reverse C-shape about the magnetic core pillar.

According to another aspect of the disclosure, a method of forming an integrated direct current (DC)/DC converter is provided. The method includes laying down, in an input section, first and second layers of interleaved input section shield materials with layers of dielectric materials interleaved between the first and second layers of interleaved input section shield materials. The method also includes laying down, in an output section, first and second layers of interleaved output section shield materials with layers of dielectric materials interleaved between the first and second layers of interleaved output section shield materials, assembling, in a transformer area between the input and output sections, a magnetic core pillar between top and bottom magnetic core portions and interleaving, in the transformer area, layers of dielectric materials with layers of magnetic core materials with windings, extensions of the first layers of input section shield materials or extensions of second layers of output section shield materials.

In accordance with additional or alternative embodiments, the method further includes laying down the magnetic core materials in C- and reverse C-shapes about the magnetic core pillar in the layers of magnetic core materials with windings, extensions of the first layers of input section shield materials or extensions of second layers of output section shield materials.

These and other advantages and features will become more apparent from the following description taken in conjunction with the drawings.

BRIEF DESCRIPTION OF THE DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

FIG. 2A is a side view of an integrated DC/DC power converter for use in the antenna array power system of FIG. 1;

FIG. 2B is an enlarged side view of a transformer area of the integrated DC/DC power converter of FIG. 2A;

FIG. 3 is a cross-sectional view taken along line 3-3 of FIG. 2A;

FIG. 4 is a cross-sectional view taken along line 4-4 of FIG. 2A;

FIG. 5 is a cross-sectional view taken along line 5-5 of FIG. 2A; and

FIG. 6 is a cross-sectional view taken along line 6-6 of FIG. 2A;

Figure 1:
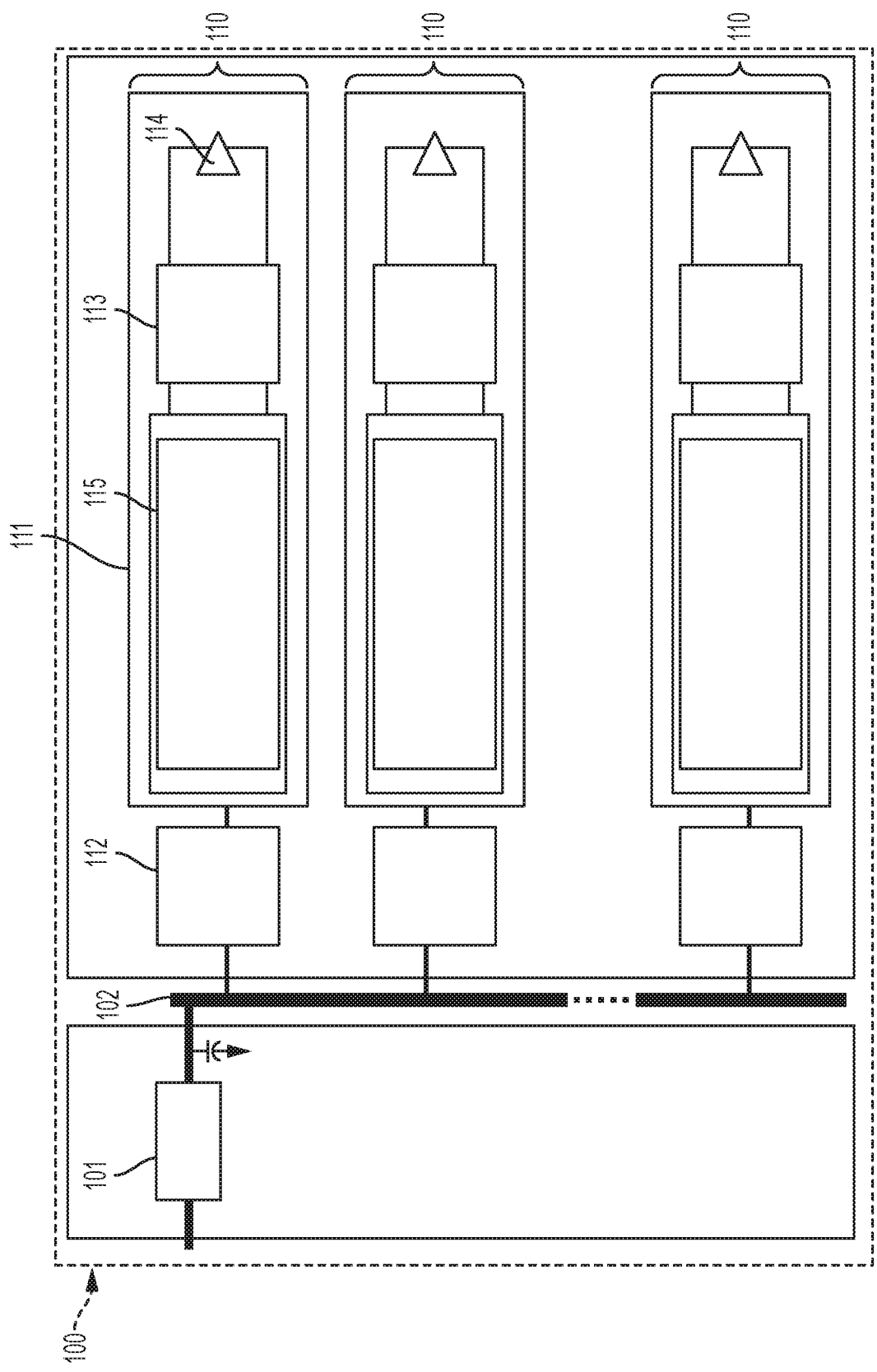
FIG. 1 is a schematic diagram of an antenna array power system in accordance with embodiments.

These and other advantages and features will become more apparent from the following description taken in conjunction with the drawings.

DETAILED DESCRIPTION

As will be described below, an architecture for an antenna array power system is provided with T/R module or channel-based DC/DC converters. This leads to a system that is simplified relative to conventional systems and universal T/RIMM elements that provide for greater portability when certain voltages (e.g., 300 VDC) are available from a common source. The architecture is characterized in that most of its power conversion components are disposed in the antenna array, which leads to a smaller, lighter and a higher performance and low cost system overall.

In typical power conversion systems, common mode (CM) currents are generated by switching transitions and are coupled to an equipment ground by parasitic capacitance. At a load, the CM currents are converted into differential-mode ripples and noise. Meanwhile, differential (i.e., line-to-line) filters do not attenuate CM currents and an effectiveness of dedicated CM filters can be limited because CM currents often have wide ranges and high frequencies of up to hundreds of megahertz. Thus, it is often difficult to suppress CM currents without adding substantial electro-magnetic interference (EMI) filtering.

In the presently claimed invention, however, high quality factor (Q) shield-to-transistor integrated low-inductance capacitor elements serve to divert CM currents, high Q shield-to-shield integrated low-inductance capacitor elements serve to compliment line-to-line filter capacitors and high Q baseplate integrated low-inductance capacitor elements serve to attenuate residual CM currents. This is achieved by integrated electrostatic shields being disposed to extend into a transformer area to contain CM currents by providing for low-inductance internal paths, the presence of "hybrid" magnetic cores that include discrete ("bulk") and integrated components to reduce magnetic reluctance and stray magnetic fields as well as composite dielectric layers that have low E, high Q dielectrics windings of magnetics and high E dielectrics for layers outside of the magnetics to reduce relative volumes of discrete capacitors.

With reference to FIG. 1, an antenna power system 100 is provided. The antenna power system 100 includes an AC/DC converter 101 that is receptive of AC, a common DC distribution bus 102 that is receptive of DC from the AC/DC converter 101 and a plurality of T/R channels 110. Each T/R channel 110 is responsible for T/R operations and includes a power amplification assembly 111 and a discrete input capacitor 112. The discrete input capacitor 112 is electrically interposed between the common DC distribution bus 102 and the power amplification assembly 111. The power amplification assembly 111 includes a discrete output capacitor 113, which is electrically interposed between a power amplifier 114 and an integrated DC/DC converter 115. The integrated DC/DC converter 115 may be provided as a galvanically-isolated bridge converter and includes shields extending into a transformer area as will be described below.

With reference to FIGS. 2A and 2B, components of the integrated DC/DC converter 115 are illustrated. As shown in FIG. 2A, the integrated DC/DC converter 115 includes a transformer area 120 that is interposed between an input section 130 and an output section 140. The input section 130 includes the discrete input capacitor 112 and the output section 140 includes the discrete output capacitor 113. The transformer area 120 includes a magnetic core top portion 121 that is formed of magnetic materials, a magnetic core bottom portion 122 that is disposed on a baseplate 123 and is formed of magnetic materials, a magnetic core pillar 124 that extends between central sections of the magnetic core top and bottom portions 121 and 122 and successive layers 125 at opposite sides of the magnetic core pillar 124. The successive layers 125 include layers of shield (i.e., metallic) and magnetic core materials, layers of windings and magnetic core materials and layers of shield and magnetic core materials, each of which are interleaved between dielectric material layers 126.

In accordance with embodiments, the magnetic core top and bottom portions 121 and 122 have similar widths, the magnetic core pillar 124 has a lesser width than the magnetic core top and bottom portions 121 and 122 and the successive layers 125 of the windings and the magnetic core materials extend outwardly to respective edges of the magnetic core top and bottom portions 121 and 122.

As shown in FIG. 2B, the successive layers 125 include a layer of primary winding materials 150 and magnetic core materials 151 as well as a layer of first primary shield materials 152 and magnetic core materials 153 above the layer of the primary winding materials 150 and the magnetic core materials 151 and a layer of second primary shield materials 154 and magnetic core materials 155 below the layer of the primary winding materials 150 and the magnetic core materials 151. In addition, the successive layers 125 include a layer of secondary winding materials 156 and magnetic core materials 157 as well as a layer of first secondary shield materials 158 and magnetic core materials 159 above the layer of the secondary winding materials 156 and the magnetic core materials 157 and a layer of second secondary shield materials 160 and magnetic core materials 161 below the layer of the secondary winding materials 156 and the magnetic core materials 157.

The layers of the first and second primary shield materials 152 and 154 extend continuously into the transformer area 120 from the discrete input capacitor 112 of the input section 130 and discontinuously correspond to layers of additional shield materials 162 (see FIG. 2A) of the discrete output capacitor 113 in the output section 140. The layers of the first and second secondary shield materials 158 and 160 extend continuously into the transformer area 120 from the discrete output capacitor 113 of the output section 140 and discontinuously correspond to layers of additional shield materials 163 (see FIG. 2A) of the discrete input capacitor 112 in the input section 130.

With reference to FIG. 3, in the layer of the first primary shield materials 152 and the magnetic core materials 153 above the layer of the primary winding materials 150 and the magnetic core materials 151, the magnetic core materials 153 form a reverse C-shape about the magnetic core pillar 124. In addition, the magnetic core materials 153 are surrounded by dielectric materials 1530 and are adjacent to a line of dielectric materials 1531. The line of dielectric materials 1531 separates the first primary shield materials 152 from the layers of the additional shield materials 162. The layer of the second primary shield materials 154 and the magnetic core materials 155 below the layer of the primary winding materials 150 and the magnetic core materials 151 are similarly formed.

With reference to FIG. 4, in the layer of the primary winding materials 150 and the magnetic core materials 151, the magnetic core materials 151 form a reverse C-shape about the magnetic core pillar 124. In addition, the magnetic core materials 151 are surrounded by dielectric materials 1510 and are adjacent to a line of dielectric materials 1511. The line of dielectric materials 1511 separates input capacitor shield materials 164 from output capacitor shield materials 165 (see FIG. 2A).

With reference to FIG. 5, in the layer of the first secondary shield materials 158 and the magnetic core materials 159 above the layer of the secondary winding materials 156 and the magnetic core materials 157, the magnetic core materials 159 form a C-shape about the magnetic core pillar 124. In addition, the magnetic core materials 159 are surrounded by dielectric materials 1590 and are adjacent to a line of dielectric materials 1591. The line of dielectric materials 1591 separates the first secondary shield materials 158 from the layers of the additional shield materials 163. The layer of the second secondary shield materials 160 and the magnetic core materials 161 below the layer of the secondary winding materials 156 and the magnetic core materials 157 are similarly formed.

With reference to FIG. 6, in the layer of the secondary winding materials 156 and the magnetic core materials 157, the magnetic core materials 157 form a C-shape about the magnetic core pillar 124. In addition, the magnetic core materials 157 are surrounded by dielectric materials 1570 and are adjacent to a line of dielectric materials 1571. The line of dielectric materials 1571 separates output capacitor shield materials 166 from input capacitor shield materials 167 (see FIG. 2A).

The output capacitor shield materials 165 may be similar materials as those of the layers of the first and second secondary shield materials 158 and 160. Similarly, the input capacitor shield materials 167 may be similar materials as those of the layers of the first and second primary shield materials 152 and 154.

In accordance with embodiment, all of the layers of the primary and secondary shield materials can occupy a same volume on separate layers only in the transformer area 120.

This serves to reduce transformer feed-through capacitance (i.e., primary shields do not cross over to the secondary side and vice versa). In addition, layers of shield materials that are referenced to a highest DC voltage (either primary or secondary) may be extended under the transformer area 120.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. An integrated converter of an antenna power system, the integrated converter comprising:
    a baseplate;
    a transformer area interposed between input and output sections, the transformer area comprising:
        a magnetic core top portion;
        a magnetic core bottom portion disposed on the baseplate;
        a magnetic core pillar extending between central sections of the magnetic core top and bottom portions; and
        successive layers of shield and magnetic core materials, windings and magnetic core materials and shield and magnetic core materials interleaved between dielectric material layers at opposite sides of the magnetic core pillar.

2. The integrated converter according to claim 1, wherein the integrated converter is provided as a galvanically-isolated bridge converter.

3. The integrated converter according to claim 1, wherein the shield materials comprise metallic materials.

4. The integrated converter according to claim 1, wherein:
    the magnetic core top and bottom portions have same widths,
    the magnetic core pillar has a lesser width than the magnetic core top and bottom portions, and
    the successive layers of the windings and the magnetic core materials extend outwardly to respective edges of the magnetic core top and bottom portions.

5. The integrated converter according to claim 1, wherein the successive layers comprise:
    primary winding materials;
    first and second primary shield materials above and below the primary winding materials;
    secondary winding materials; and
    first and second secondary shield materials above and below the secondary winding materials.

6. The integrated converter according to claim 5, wherein:
    the first and second primary shield materials extend continuously into the transformer area from the input section, and
    the first and second secondary shield materials extend continuously into the transformer area from the output section.

7. The integrated converter according to claim 5, wherein:
    the first and second primary shield materials discontinuously correspond to shield materials in the output section, and
    the first and second secondary shield materials discontinuously correspond to shield materials in the input section.

8. The integrated converter according to claim 1, wherein the magnetic core materials in each successive layer of shield and magnetic core materials form a C-shape or a reverse C-shape about the magnetic core pillar.

9. The integrated converter according to claim 1, wherein the successive layers of shield and magnetic core materials comprise:
    a layer of primary shield, magnetic core and additional shield materials, wherein the magnetic core materials form a reverse C-shape about the magnetic core pillar and the core pillar dielectric materials, are surrounded by dielectric materials and are adjacent to a line of dielectric materials separating the primary and additional shield materials;
    a layer of primary winding, magnetic core and input and output capacitor shield materials, wherein the magnetic core materials form a reverse C-shape about the magnetic core pillar and the core pillar dielectric materials, are surrounded by dielectric materials and are adjacent to a line of dielectric materials separating the input and output capacitor shield materials;
    a layer of secondary shield, magnetic core and additional shield materials, wherein the magnetic core materials form a C-shape about the magnetic core pillar and the core pillar dielectric materials, are surrounded by dielectric materials and are adjacent to a line of dielectric materials separating the secondary and additional shield materials; and
    a layer of secondary winding, magnetic core and input and output capacitor shield materials, wherein the magnetic core materials form a C-shape about the magnetic core pillar and the core pillar dielectric materials, are surrounded by dielectric materials and are adjacent to a line of dielectric materials separating the input and output capacitor shield materials.

10. A method of forming an integrated direct current (DC)/DC converter, the method comprising:
    laying down, in an input section, first and second layers of interleaved input section shield materials with layers of dielectric materials interleaved between the first and second layers of interleaved input section shield materials;
    laying down, in an output section, first and second layers of interleaved output section shield materials with layers of dielectric materials interleaved between the first and second layers of interleaved output section shield materials;
    assembling, in a transformer area between the input and output sections, a magnetic core pillar between top and bottom magnetic core portions;
    surrounding the magnetic core pillar with magnetic core pillar dielectric materials; and
    interleaving, in the transformer area, layers of dielectric materials with layers of magnetic core materials with windings, extensions of the first layers of input section shield materials or extensions of second layers of output section shield materials at opposite sides of the magnetic core pillar and the core pillar dielectric materials.

11. The method according to claim 10, further comprising laying down the magnetic core materials in C- and reverse C-shapes about the magnetic core pillar and the core pillar dielectric materials in the layers of magnetic core materials with windings, extensions of the first layers of input section shield materials or extensions of second layers of output section shield materials.

\* \* \* \* \*